(12) United States Patent
Chen

(10) Patent No.: US 10,312,218 B1
(45) Date of Patent: Jun. 4, 2019

(54) METHOD FOR BINDING MICRO DEVICE TO SUBSTRATE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/040,558

(22) Filed: Jul. 20, 2018

(51) Int. Cl.
*H01L 23/00* (2006.01)
*H01L 33/62* (2010.01)

(52) U.S. Cl.
CPC .............. *H01L 24/83* (2013.01); *H01L 24/32* (2013.01); *H01L 33/62* (2013.01); *H01L 2224/32227* (2013.01); *H01L 2224/83102* (2013.01); *H01L 2924/12041* (2013.01); *H01L 2933/0066* (2013.01)

(58) Field of Classification Search
CPC ......... H01L 24/83; H01L 24/32; H01L 33/62; H01L 2933/0066; H01L 2224/32227; H01L 2924/12041; H01L 2224/83102
See application file for complete search history.

(56) References Cited

U.S. PATENT DOCUMENTS

| | | | | |
|---|---|---|---|---|
| 2010/0029059 A1* | 2/2010 | Matsumura | ........... | C08F 220/18 438/464 |
| 2010/0142189 A1* | 6/2010 | Hong | ................... | C09K 11/616 362/97.3 |
| 2015/0318260 A1* | 11/2015 | Lin | ......................... | B23K 20/02 438/455 |
| 2016/0075871 A1* | 3/2016 | Morita | ................ | H01L 21/6836 438/118 |
| 2017/0053824 A1* | 2/2017 | Wang | .................. | H01L 21/7624 |
| 2018/0315729 A1* | 11/2018 | Sugo | .................... | H01L 21/6836 |
| 2019/0043824 A1* | 2/2019 | Sugo | .................... | H01L 21/6836 |
| 2019/0055467 A1* | 2/2019 | Ota | ........................... | B32B 9/00 |

* cited by examiner

*Primary Examiner* — John P. Dulka
(74) *Attorney, Agent, or Firm* — CKC & Partners Co., LLC

(57) ABSTRACT

A method for binding a micro device to a substrate is provided. The method includes: locally showering a gas on a portion of the substrate, wherein the gas has a water vapor pressure higher than an ambient water vapor pressure; and placing the micro device over the portion of the substrate after a part of water in the gas is condensed to form a liquid layer on the portion of the substrate and contacting the micro device with the liquid layer, so that the micro device is gripped by a capillary force produced by the liquid layer and is substantially held in a position within a controllable region on the substrate.

11 Claims, 5 Drawing Sheets

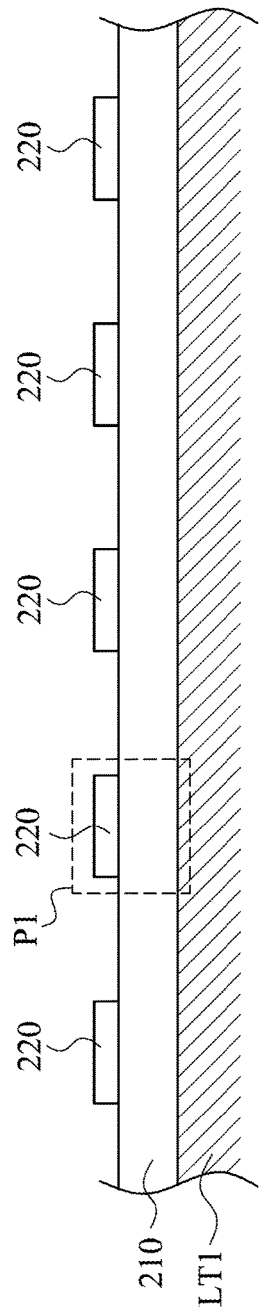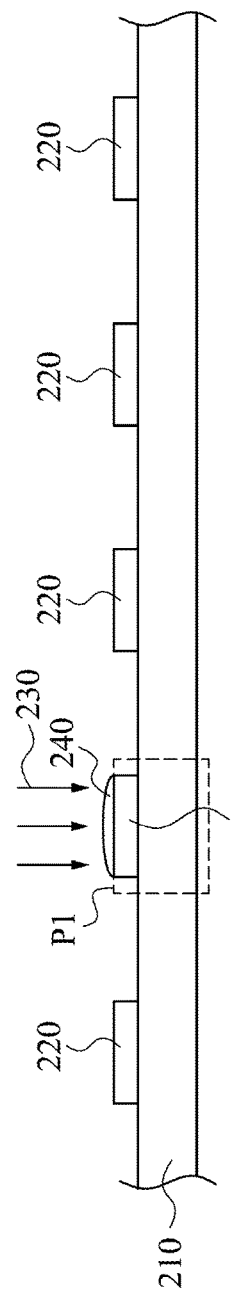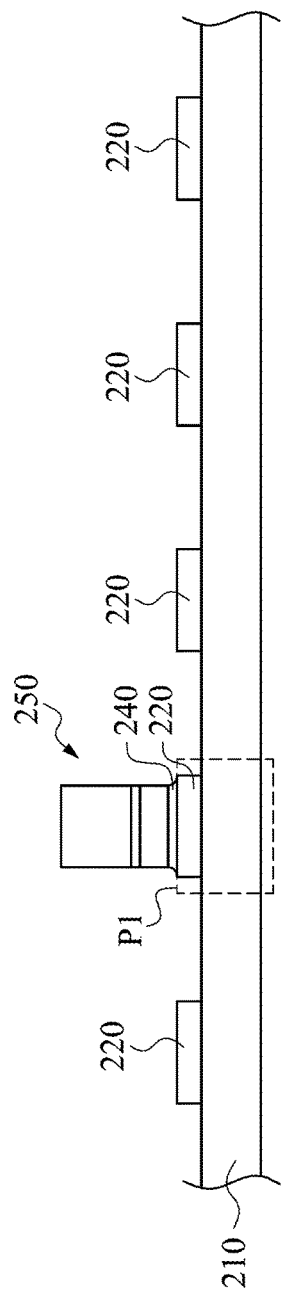

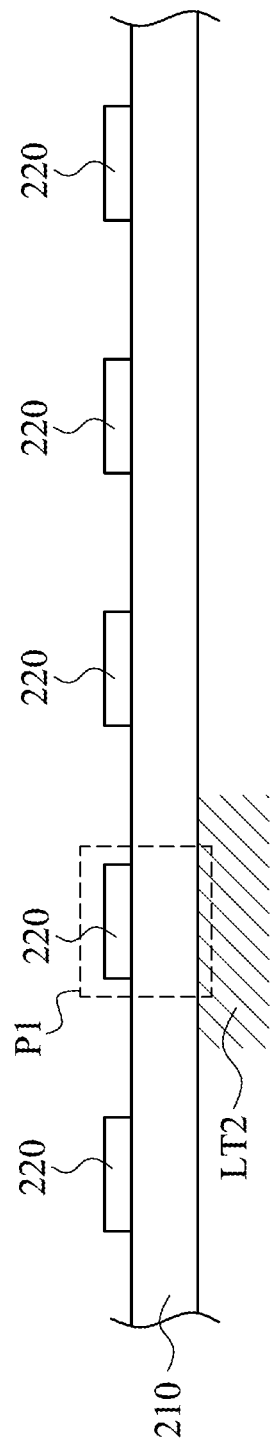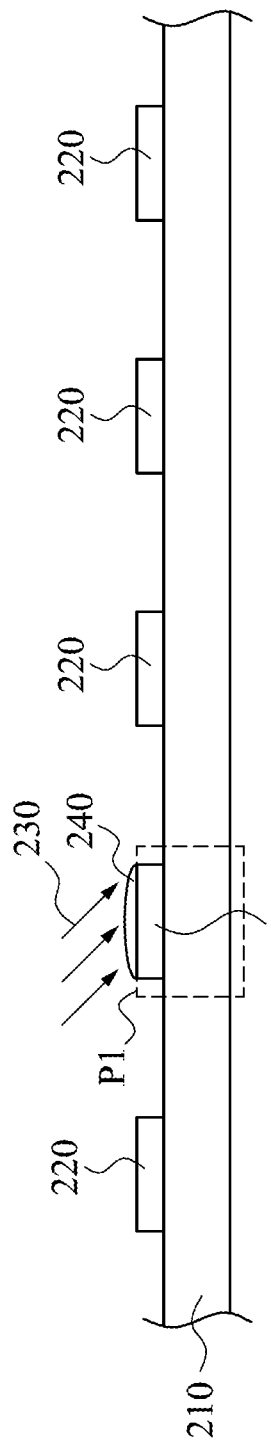

METHOD FOR BINDING MICRO DEVICE TO SUBSTRATE

BACKGROUND

Field of Invention

The present disclosure relates to a method for binding a micro device to a substrate.

Description of Related Art

The statements in this section merely provide background information related to the present disclosure and do not necessarily constitute prior art.

In recent years, micro devices have become popular in various applications. Among all technical aspects of micro devices, transfer process is one of the most challenging tasks for micro devices to be commercialized. One of the important issues of the transfer process is bonding the micro devices to a substrate.

SUMMARY

According to some embodiments of the present disclosure, a method for binding a micro device to a substrate is provided. The method includes: locally showering a gas on a portion of the substrate, in which the gas has a water vapor pressure higher than an ambient water vapor pressure; and placing the micro device over the portion of the substrate after a part of water in the gas is condensed to form a liquid layer on the portion of the substrate and contacting the micro device with the liquid layer, so that the micro device is gripped by a capillary force produced by the liquid layer and is substantially held in a position within a controllable region on the substrate.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 2A is a schematic cross-sectional view of one of intermediate steps of the method of FIG. 1 according to some embodiments of the present disclosure;

FIG. 2B is a schematic cross-sectional view of one of the intermediate steps of the method of FIG. 1 according to some embodiments of the present disclosure;

FIG. 2C is a schematic cross-sectional view of one of the intermediate steps of the method of FIG. 1 according to some embodiments of the present disclosure;

FIG. 3 is a schematic cross-sectional view of one of the intermediate steps of method of FIG. 1 according to some embodiments of the present disclosure;

FIG. 4 is a schematic cross-sectional view of one of the intermediate steps of method of FIG. 1 according to some embodiments of the present disclosure;

DETAILED DESCRIPTION

Figure 1:
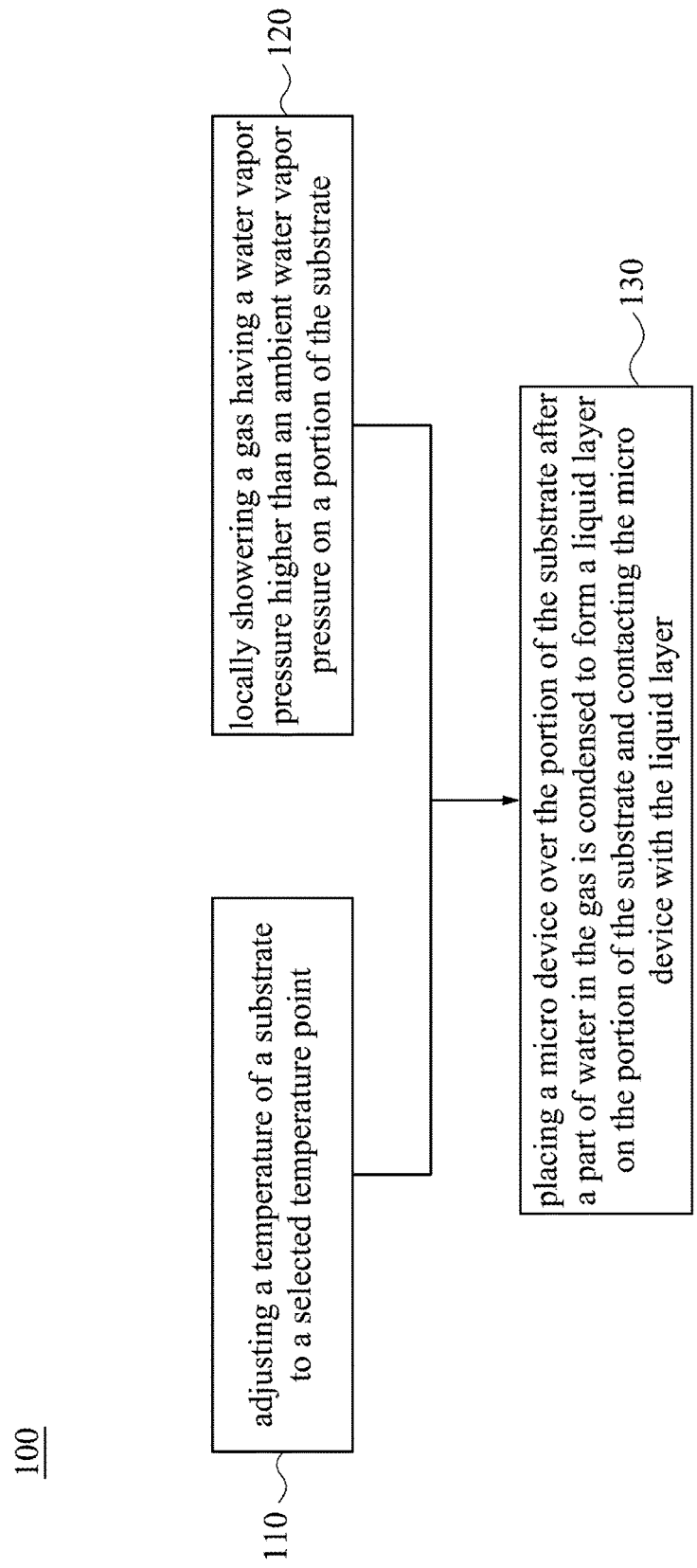
FIG. 1 is a schematic flow chart of a method for binding a micro device to a substrate according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Reference is made to FIGS. 1, 2A to 2C, 3, 4, 5A to 5C, and 6A to 6C. FIG. 1 is a schematic flow chart of a method 100 for binding a micro device to a substrate according to some embodiments of the present disclosure. FIGS. 2A to 6C each is a schematic cross-sectional view of one of intermediate steps of the method of FIG. 1 according to some embodiments of the present disclosure. Although most of terms described in the following disclosure use singular nouns, said terms may also be plural in accordance with figures or practical applications.

The method 100 begins with optional operation 110 and operation 120 in which a temperature of a substrate 210 is adjusted to a selected temperature point (e.g., referred to FIG. 2A, an optional operation) and a gas 230 is locally showered on a portion P1 of a substrate 210 (e.g., referred to FIG. 2B). The method 100 continues with operation 130 in which a micro device 250 is placed over the portion P1 of the substrate 210 after a part of water in the gas 230 is condensed to form a liquid layer 240 on the portion of the substrate (e.g., referred to FIG. 2B), and the micro device 250 is in contact with the liquid layer 240 (e.g., referred to FIG. 2C). In the following paragraphs, different embodiments which are used to perform similar operations will be present in the same paragraph for convenience in comparison and to simplify the contents of the present disclosure. The sequence of optional operation 110 and operation 120 is not limited by the above description. In some embodiments, the sequence of said adjusting the temperature of the substrate 210 in optional operation 110 and the gas 230 showering in operation 120 can be interchanged. In some embodiments, said adjusting the temperature of the substrate 210 in optional operation 110 and the gas 230 showering in operation 120 are performed at the same time. Besides, a duration of said adjusting the temperature and a duration of the gas 230 showering respectively can be tuned independently, such that said two durations can be separate or overlapped in time. Furthermore, optional operation 110 can be omitted in some embodiments of the present disclosure.

Reference is made to FIGS. 2A, 3, 5A, and 6A, which are figures illustrating some embodiments of optional operation 110. In some embodiments, the temperature of the substrate 210 is adjusted to a selected temperature point so that after a gas 230 showing is conducted on a portion (P1 or P2) or the entire of the substrate 210 (which will be illustrated later), a part of water in the gas 230 will be condensed to form a liquid layer 240 on the portion (P1 or P2) or the entire of the substrate 210. In some embodiments, said selected temperature point is a dew point. In some other embodiments when the temperature and the water vapor pressure (i.e. partial pressure of water vapor) of the gas 230 are high enough, such as 35 degrees Celsius and 80% of the saturation (water) vapor pressure (but should not be limited thereto) as compared to an ambient temperature (e.g., 23 degrees Celsius) and an ambient water vapor pressure (e.g., 45% of the saturation vapor pressure), an amount of adjusting the temperature of the substrate 210 can be zero degrees Celsius (i.e. there is no need to adjust the temperature of the substrate 210 in this embodiment) since the temperature of the substrate 210 already reaches said condensation point.

Figure 5A:
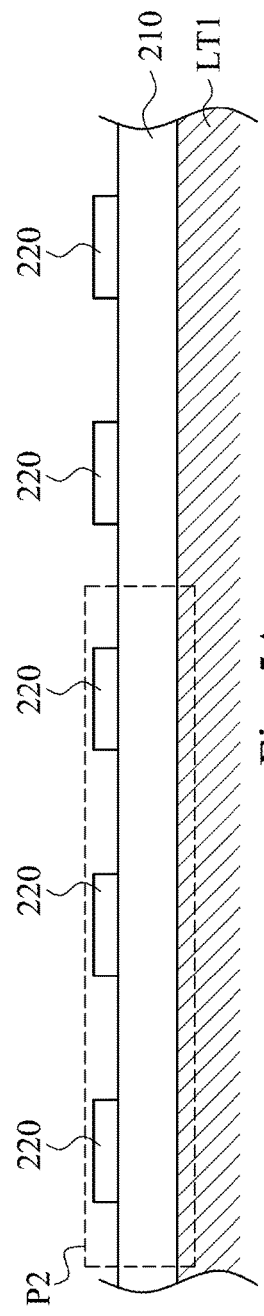
FIG. 5A is a schematic cross-sectional view of one of the intermediate steps of the method of FIG. 1 according to some embodiments of the present disclosure.
Figure 6A:
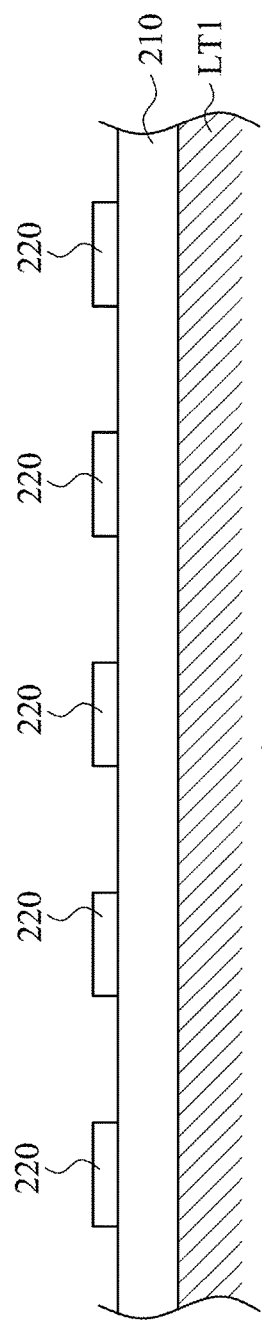
FIG. 6A is a schematic cross-sectional view of one of the intermediate steps of the method of FIG. 1 according to some embodiments of the present disclosure.

In some embodiments, the temperature of the entire substrate 210 can be adjusted simultaneously, such as embodiments illustrated by FIGS. 2A, 5A, and 6A in which a cooling device LT1 is used to lower the temperature of the entire substrate 210. The temperature of the substrate 210 can also be locally adjusted, such as embodiments illustrated by FIG. 3 in which a cooling device LT2 is used to lower the temperature of the portion P1 of the substrate 210. The cooling devices LT1 and LT2 can be a cooling plate, but should not be limited thereto. The cooling devices LT1 and LT2 can also be replaced by heating devices in other practical applications. In some other embodiments, the temperature of the entire substrate 210 can be adjusted by cooling or heating the environment with the substrate 210 therein, such as cooling the substrate 210 within a cooling chamber.

Figure 5B:
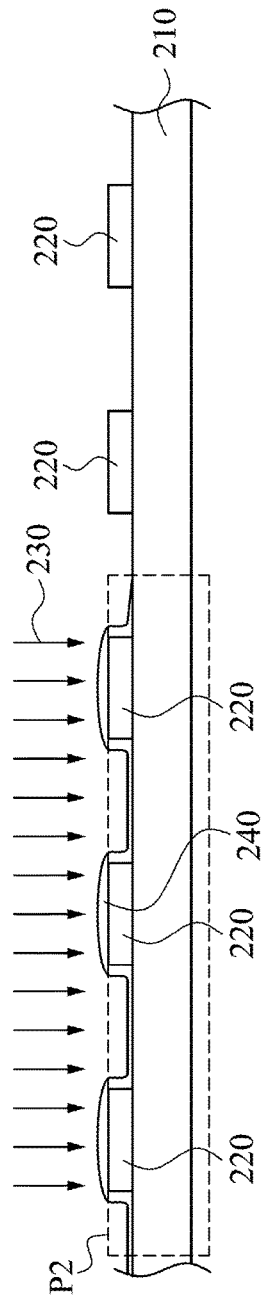
FIG. 5B is a schematic cross-sectional view of one of the intermediate steps of the method of FIG. 1 according to some embodiments of the present disclosure.
Figure 6B:
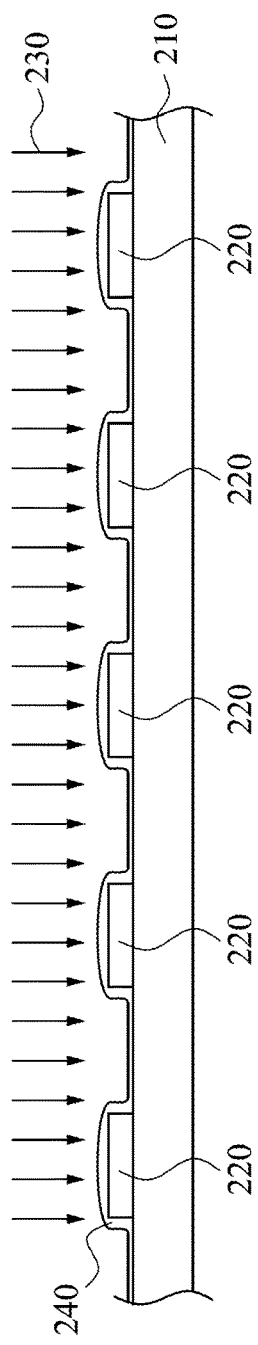
FIG. 6B is a schematic cross-sectional view of one of the intermediate steps of the method of FIG. 1 according to some embodiments of the present disclosure.

Reference is made to FIGS. 2B, 4, 5B, and 6B, which are figures illustrating some embodiments of operation 120. In some embodiments, the gas 230 is locally and normally showered on the portion P1 (indicated by a dotted line) of the substrate 210 where one micro device 250 is to be placed on as shown in FIG. 2B. Said normally showering means showering the gas 230 on the portion of the substrate 210 in a direction perpendicular to an extension direction of the substrate 210. Said portion P1 of the substrate 210 may have a conductive pad 220 present thereon for use as an electrical contact, but should not be limited thereto. The local showering mentioned above has a benefit on precise control of a water vapor pressure and a temperature of the showered gas 230. The gas 230 can also be directly showered on the conductive pad 220 or on the substrate 210. In some embodiments, there may be a plurality of the conductive pads 220, and thus the gas 230 can be showered on at least two of the conductive pads 220 on a portion P2 of the substrate 210 (e.g., indicated by a dotted line in FIG. 5B). In some other embodiments, the gas 230 can also be showered on the entire substrate 210 or the entire conductive pads 220 present on the substrate 210 (e.g., referred to FIG. 6B). Although the liquid layer 240 shown in FIGS. 5B and 6B are continuous within a showered region of the gas 230 on the substrate 210 and the conductive pads 220, the liquid layer 240 can also be discontinuous under a showered region of the gas 230 on the substrate 210 and the conductive pads 220 in some other embodiments. The gas 230 may consist essentially of nitrogen and water, but should not be completely exclude other compounds or elements. The nitrogen can be used to lower a percentage of an oxygen in the gas 230 so as to reduce an amount of oxidation of the conductive pads 220 and to improve the quality of the entire binding process. The water can be used to form a liquid layer. In some other embodiments as shown in FIG. 4, the gas 230 is locally and obliquely showered on the portion P1 of the substrate 210 where one micro device 250 is to be placed on. In some embodiments, said showering can be performed once within a time period. In some embodiments, said showering can be performed continuously throughout the operations 110 and 120, or throughout the operations 110, 120, and 130. In some embodiments, said showering can be performed in a plurality of separate time intervals.

The water vapor pressure and the temperature of the gas 230 are selected so as to form the liquid layer 240 in a more efficient way. Embodiments with the environment of the substrate 210 under a condition of the ambient temperature and the ambient water vapor pressure are shown as exemplifications, but should not be limited thereto. The exemplified ambient temperature is about 23 degrees Celsius, and the exemplified ambient water vapor pressure is about 45% of the saturation vapor pressure. In other environmental conditions having different ambient water vapor pressures and ambient temperatures, a modified water vapor pressure of the gas 230 and a modified temperature of the gas 230 can be adopted according to the illustrated principle in the embodiments of the present disclosure. In some embodiments, the water vapor pressure of the gas 230 locally (or fully) showered on the portion P1, P2 (or the entire) of the substrate 210 is between about 65% and about 100% of the saturation vapor pressure. In some embodiments, the water vapor pressure of the gas 230 locally (or fully) showered on the portion P1, P2 (or the entire) of the substrate 210 is between about 80% and about 95% of the saturation vapor pressure, and the temperature of the gas 230 locally (or fully) showered on the portion P1, P2 (or the entire) of the substrate 210 is higher than the ambient temperature. It should be noted that, said selected water vapor pressure and temperature of the gas 230 are for efficiency in forming a liquid layer 240. In some other embodiments, the temperature of the gas 230 equal to or lower than the ambient temperature also does not depart from the present disclosure.

Said efficiency includes cost efficiency and time efficiency for example. More specifically, since the water vapor pressure and the temperature of the gas 230 is controlled and selected such that an amount of adjusting of a temperature of the substrate 210 is decreased compared with embodiments without said gas 230 showering (i.e., adjusting the temperature of the substrate 210 from a condition of the ambient temperature and the ambient water vapor pressure to a temperature such that the liquid layer 240 is formed), the cost and the time can be saved. In some other embodiments, an initial temperature of the substrate 210 may be different from that of the ambient temperature. For example, the initial temperature of the substrate 210 may be 18 degrees Celsius while the ambient temperature is 23 degrees Celsius. Under this condition, the gas 230 with a temperature the same as the ambient temperature and a water vapor pressure higher (e.g., from about 80% to about 100% of the saturation vapor pressure) than the ambient water vapor pressure can be showered to reach the efficiency of forming a liquid layer 240.

During operations of the above processes (e.g., optional temperature adjusting and gas showering), a real-time temperature and water vapor pressure controller can be used to determine the water vapor pressure and the temperature of the showered gas 230 and said selected temperature point of the substrate 210 in accordance with the detected ambient water vapor pressure and ambient temperature. That is, correlations between the water vapor pressures plus the temperatures of the showered gas 230 and the ambient water vapor pressures plus the ambient temperatures which have been shown in the various embodiments mentioned above can be used as rules for determine a real-time water vapor pressure and a real-time temperature of the showered gas 230 and real-time said selected temperature point of the substrate 210 by said controller. In some embodiments, the Arden Buck equations, which are a group of empirical correlations relating the saturation vapor pressure to a given temperature, can be a guidance for forming a liquid layer 240 in some embodiments of the present disclosure. For example, the ambient temperature is first detected, and then the saturation vapor pressure is derived from the Arden Buck equations with said ambient temperature as an input temperature. Since the water vapor may be condensed to form the liquid layer 240 at the relative humidity roughly higher than about 85% (referred to e.g., FIG. 1 of "The adhesion of Solid Particles to Solid Surfaces, I. a Review", Morton Corn, *Journal of the Air Pollution Control Association* Vol. 11, No. 11, 523-528 (1961)), the water vapor pressure of the showered gas 230 which can be used to reach about 85% of said saturation vapor pressure can thus be determined. In some other embodiments, a table of vapor pressure versus temperature of water (e.g., the table in page 6-5 of "CRC Handbook of Chemistry and Physics", 97$^{th}$ edition, W. M. Haynes) can be used to, such as determining the selected temperature point of the substrate 210 by the detected ambient water vapor pressure.

Figure 5C:
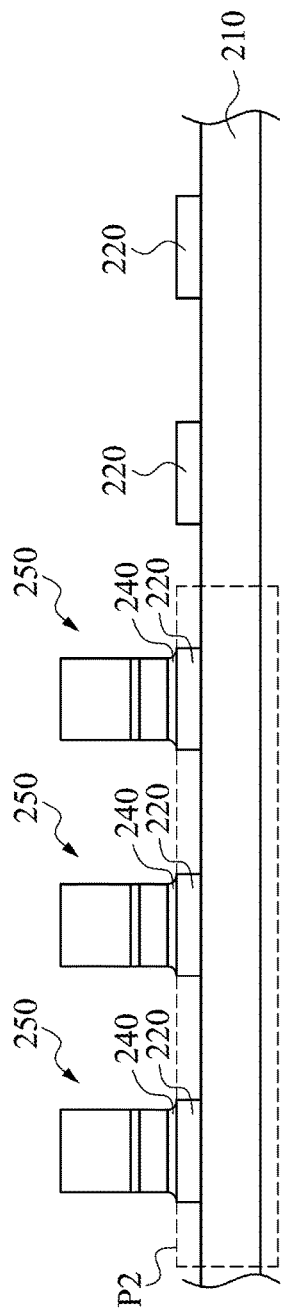
FIG. 5C is a schematic cross-sectional view of one of the intermediate steps of the method of FIG. 1 according to some embodiments of the present disclosure.
Figure 6C:
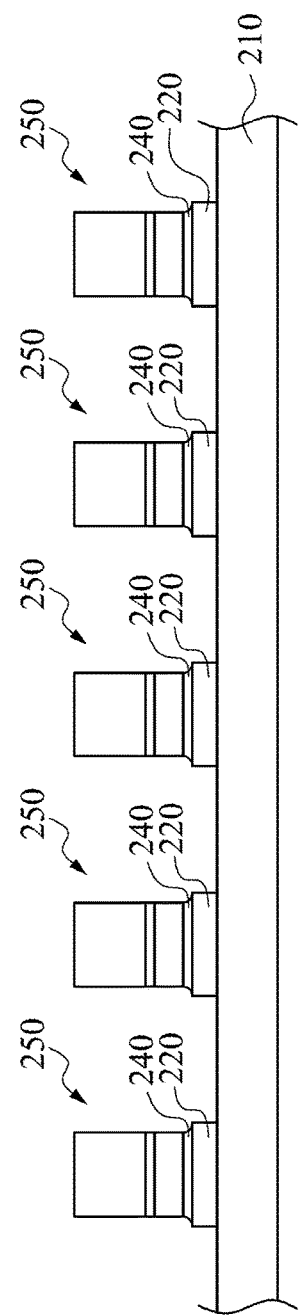
FIG. 6C is a schematic cross-sectional view of one of the intermediate steps of the method of FIG. 1 according to some embodiments of the present disclosure.

Reference is made to FIGS. 2C, 5C, and 6C. In some embodiments, the micro device 250 is placed over said portion P1 of the substrate 210 and is in contact with the liquid layer 240, so that the micro device 250 is gripped by a capillary force produced by the liquid layer 240 and is substantially held in a position within a controllable region on the substrate 210 as shown in FIG. 2C. In some embodiments, the contacting is performed within about 10 seconds after the liquid layer 240 is formed on the portion P1 of the substrate 210 to avoid evaporation of the liquid layer 240 before the contacting. Besides, due to the locally control of the formation of the liquid layer 240 and the instant contacting (e.g., said contacting within about 10 seconds) after the formation of the liquid layer 240, the quality of binding (referred to the next four paragraph) the micro device 250 to the substrate 210 is greatly enhanced. In some other embodiments, a plurality of micro devices 250 are placed on said portion P2 or the entire of the substrate 210 and are in contact with the liquid layer 240 as shown in FIGS. 5C and 6C, and similar contents which have been mentioned in describing embodiments of FIG. 2C are omitted herein.

In some embodiments, said controllable region is on the at least one conductive pad 220. In some embodiments, the micro device 250 is a micro light emitting device which includes an active layer present between a first type semiconductor layer and a second type semiconductor layer, but should not be limited thereto. The first and second type semiconductor layers can be a p-type semiconductor layer and an n-type semiconductor layer respectively, and the active layer can be a quantum well or a multiple quantum well, but should not be limited thereto. In some embodiments, the micro device 250 further includes a bonding layer present on the first type semiconductor layer or on the second type semiconductor layer, and the bonding layer is in contact with the liquid layer 240 after the micro device 250 is placed over the substrate 210. The bonding layer may include a solder material, such as tin (Sn), but should not be limited thereto.

Although different embodiments related to the same operation are described at the same time for convenience in comparison in the above paragraphs (e.g., the embodiments of FIGS. 2A, 3, 5A, and 6A are illustrated in the same paragraph), in some embodiments such as figures mentioned above, FIGS. 2A to 2C can be viewed as a complete embodiment for binding one micro device 250 to the portion P1 of the substrate 210, FIGS. 5A to 5C can be viewed as a complete embodiment for binding a plurality of micro devices 250 to the portion P2 of the substrate 210, and FIGS. 6A to 6C can be viewed as a complete embodiment for binding a plurality of micro devices 250 to the entire substrate 210.

After the micro device 250 is gripped by the capillary force, the liquid layer 240 can be evaporated (e.g., by heating), so that the micro device 250 is in contact with the substrate 210 or the conductive pad 220. Said contact can occur between one of the first and second type semiconductor layers and the substrate 210, between one of the first and second type semiconductor layers and the conductive pad 220, between the bonding layer and the substrate 210, or between the bonding layer and the conductive pad 220. Besides, said contact can be especially related to electrical contact, but should not be limited thereto.

In some embodiments, at least one of a lateral length and a thickness of the micro device 250 is equal to or smaller than 50 μm. The lateral length described herein is a maximum length of the micro device 250 parallel to the extending direction of the substrate 210. The thickness described herein is a maximum length of the micro device 250 perpendicular to the extending direction of the substrate 210. A size of the micro device 250 with the above range (i.e., said at least one of the lateral length and the thickness is equal to or smaller than 50 μm) can reach the condition of holding the micro device 250 in a position within a controllable region on the substrate 210 by the capillary force of the liquid layer 240 and, in a solid contact with the substrate 210 or the conductive pad 220 after the liquid layer 240 is evaporated.

In summary, embodiments of the present disclosure provide a method for binding a micro device to a substrate, in which a gas is locally showered on the substrate and the liquid layer is formed by the showered gas, so as to bind the micro device to the substrate. As such, humidity and a temperature for binding are better controlled due to locally controlled liquid layer formation and instant placing after the formation of the liquid layer, so that the quality of binding is enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for binding a micro device to a substrate, comprising:
   locally showering a gas on a portion of the substrate, wherein the gas has a water vapor pressure higher than an ambient water vapor pressure; and
   placing the micro device over the portion of the substrate after a part of water in the gas is condensed to form a liquid layer on the portion of the substrate and contacting the micro device with the liquid layer so that the micro device is gripped by a capillary force produced by the liquid layer and is substantially held in a position within a controllable region on the substrate.

2. The method of claim 1, further comprising adjusting a temperature of the substrate to a selected temperature point.

3. The method of claim 2, wherein the selected temperature point is a dew point.

4. The method of claim 2, wherein the adjusting is performed on the portion of the substrate.

5. The method of claim 2, wherein the adjusting is performed on the entire substrate.

6. The method of claim 1, wherein the gas consists essentially of nitrogen and water.

7. The method of claim 1, wherein the contacting is performed within about 10 seconds after the liquid layer is formed on the portion of the substrate.

8. The method of claim 1, further comprising preparing the substrate with at least one conductive pad thereon.

9. The method of claim 8, wherein said locally showering is showering the gas on one of the at least one conductive pad on the portion of the substrate.

10. The method of claim 8, wherein a number of the at least one conductive pad is plural, and said locally showering is showering the gas on at least two of the conductive pads on the portion of the substrate.

11. The method of claim 8, wherein said controllable region is on the at least one conductive pad.

* * * * *